US008750530B2

(12) United States Patent
Eisenberg et al.

(10) Patent No.: US 8,750,530 B2
(45) Date of Patent: Jun. 10, 2014

(54) METHOD AND ARRANGEMENT FOR PROCESSING AUDIO DATA, AND A CORRESPONDING CORRESPONDING COMPUTER-READABLE STORAGE MEDIUM

(75) Inventors: Gunnar Eisenberg, Brieselang (DE); Frank Elting, Berlin (DE)

(73) Assignee: Native Instruments GmbH, Berlin (DE)

( * ) Notice: Subject to any disclaimer, the term of this patent is extended or adjusted under 35 U.S.C. 154(b) by 652 days.

(21) Appl. No.: 12/883,001

(22) Filed: Sep. 15, 2010

(65) Prior Publication Data

US 2011/0064244 A1    Mar. 17, 2011

(30) Foreign Application Priority Data

Sep. 15, 2009  (DE) .......................... 10 2009 041 327
Sep. 18, 2009  (DE) .......................... 10 2009 029 615

(51) Int. Cl.
*H03B 29/00*     (2006.01)
*G06F 17/00*     (2006.01)

(52) U.S. Cl.
USPC .......................................... 381/71.12; 700/94

(58) Field of Classification Search
CPC .......... H03G 9/005; A61F 11/06; G06F 17/00
USPC ................ 381/61, 98, 103, 71.12, 57; 700/94
See application file for complete search history.

(56) References Cited

U.S. PATENT DOCUMENTS

| 7,003,120    | B1   |   | 2/2006  | Smith et al.                |
|--------------|------|---|---------|-----------------------------|
| 7,302,062    | B2   | * | 11/2007 | Christoph ............ 381/57 |
| 2007/0256551 | A1   | * | 11/2007 | Knapp et al. ......... 84/722 |
| 2008/0075292 | A1   |   | 3/2008  | Wong et al.                 |
| 2008/0181422 | A1   | * | 7/2008  | Christoph .......... 381/73.1 |
| 2008/0300702 | A1   | * | 12/2008 | Gomez et al. ......... 700/94 |

FOREIGN PATENT DOCUMENTS

DE    600 31 812    9/2007

* cited by examiner

*Primary Examiner* — Fan Tsang
*Assistant Examiner* — Eugene Zhao
(74) *Attorney, Agent, or Firm* — Enshan Hong; Kent H. Cheng; VLP Law Group LLP

(57) ABSTRACT

A method and an arrangement for processing audio data, and a corresponding computer program and a corresponding computer-readable storage medium, which can be used, in particular, in the field of audio software and sampling. At least a first spectrum with at least one first spectral property is removed from the spectrum of the audio data, the resulting spectrum of the audio data is transformed after removal of the at least one first spectrum, and the at least one first spectrum or at least one of the first spectrum and/or at least one second spectrum with at least one second spectral property are impressed on the transformed spectrum.

22 Claims, 3 Drawing Sheets

METHOD AND ARRANGEMENT FOR PROCESSING AUDIO DATA, AND A CORRESPONDING CORRESPONDING COMPUTER-READABLE STORAGE MEDIUM

RELATED APPLICATIONS

This application claims the priority of German application no. 10 2009 041 327.8 filed Sep. 15, 2009 and DE 10 2009 029 615.8 filed Sep. 18, 2009, the entire content of both of which are hereby incorporated by reference.

FIELD OF THE INVENTION

The invention relates to a method and an arrangement for processing audio data, and a corresponding computer program and a corresponding computer-readable storage medium, which can be used, in particular, in the technical field of audio software and sampling.

DESCRIPTION OF THE RELATED ART

The tones of natural instruments form their loudness and their tone color depending on the strike force. The more strongly a tone is struck, the louder and clearer it sounds. This essential feature of expression contributes significantly to the tonal impression of an instrument.

In conventional samplers, only the loudness of the tones varied is frequently depending on the strike force, which causes a static and hence very unnatural tonal impression. Sometimes, simple filter structures are used which filter out, for example, harmonics of soft tones with low-pass filters. However, this improves the tonal impression only slightly.

Other conventional methods use a plurality of samples which are each used for different strike forces. However, audible tonal differences are generally produced during a transition between these samples. This can frequently be prevented by implementing cross-fading between the samples, with the disadvantage that two samples are audible at the same time. This produces beat frequencies causing an unnatural tonal impression.

Natural instruments impress on all tones that can be generated by these instruments a defined formant structure which is determined by certain resonances. These resonances are unaffected by the fundamental frequency of a played tone and represent an important characteristic of the instrument. If natural instruments are sampled, then this characteristic is reflected in each individual audio sample. The influence of this characteristic will hereinafter be referred to as a spectral fingerprint.

If a tone is directly transposed inside a sampler, then the formant structure is transposed with it, which results in unnatural tonal results. This may be prevented by applying a formant correction. According to the invention, this formant correction equalizes the formant resonances before the transposition and reintroduces them again after the transposition.

In the technical field of the invention, conventional methods are also employed to manipulate and transform the tones of the individual samples inside a sampler. A part of this method uses the filter bank composed of EQ (equalizer) filters. These are implemented in IIR (Infinite Impulse Response) technology and represent a classical filter bank which is known from mixing consoles and effect generators. In this solution, the filters are adjusted by the user.

Also known are applications for mastering complex musical signals, wherein an EQ-curve of another signal is impressed on a completed mix. An FFT-based FIR filter (FFT=Fast Fourier Transform, FIR=Finite Impulse Response) is here also employed, with this solution using only a single filter. The analysis in these applications assumes complex music signals and therefore does not analyze harmonics and related formant structures. In an alternative solution for mastering complex musical signals, a spectrum, which has been analyzed with an FTT, may be transformed into a 30 band filter bank.

SUMMARY OF THE INVENTION

It is therefore an object of the invention to provide a method and an arrangement for processing audio data as well as a corresponding computer program and a corresponding computer-readable storage medium, which obviate the disadvantages of prior art solutions and, more particularly, produce a natural tonal impression with synthetic instruments.

It is a particular advantage of the invention that the variation range of the tone is mapped depending on the strike force, without having to contend with the aforementioned disadvantages. This is achieved by removing with the method for processing audio data according to the invention from the spectrum of the audio data at least a first spectrum with at least one first spectral property. Preferably, the at least one first spectrum with the first spectral property is filtered out of the spectrum of the audio data. After the at least one first spectrum with the first spectral property is removed from the spectrum of the audio data, in a first alternative of the invention, at least one second spectrum with at least one second spectral property is impressed on the spectrum of the audio data. The impression is preferably performed by using a filter.

The at least one first and/or second spectral property may be, for example, the tone color of a particular instrument. In this way, the tone color of a different tone can be impressed on the audio data, without generating, as with conventional solutions, for example beat frequencies caused by cross-fading of two samples.

According to another alternative embodiment of the invention, after the at least one first spectrum with the at least one first spectral property has been removed, the spectrum of the audio data is changed by changing, for example, the frequency and/or pitch of the audio data. After such change of the spectrum of the audio data, at least a part of the at least one first spectrum with the at least one first spectral property and/or of the at least one second spectrum with the at least one second spectral property is impressed on the changed spectrum. In this way, an audio sample can be changed with respect to the pitch, loudness or other tone parameters, whereby the corresponding natural tone is then obtained by the impressed spectrum with the spectral property, thereby producing a natural tonal impression. The same methods can be used to impress, for example, the tone color (tone characteristic) of a guitar onto an audio sample of a piano.

The first and second spectral property may be, for example, the spectral property at the beginning and/or at the end of a desired or realizable variation range of the audio data. For example, the first spectral property may represent the tone color of very soft or very low tones, whereas the second spectral property may represent the tone color of very loud or very high tones. When the first and second spectral properties are impressed, the spectra are preferably weighted depending on the position of the target sample in the variation range of the audio data. If the target sample is, for example, located close to the soft end of the variation range, then the at least one spectrum representing the tone colors of soft tones has a greater weight, whereas the at least one spectrum representing the tone colors of loud tones has a lesser weight. Weighting can be performed, for example, by defining a corresponding strike force.

As already mentioned above, in a preferred embodiment, the spectra with the (at least one) first spectral property are removed from the spectrum of the audio data by filtering, and the spectra with the (at least one) second spectral property are impressed on the spectrum of the audio data. According to an advantageous embodiment of the invention, the inverted at least one first spectrum is used as a filter spectrum for removing the at least one first spectrum. In another advantageous embodiment of the invention, the (optionally) weighted spectrum of the spectral property to be impressed is used directly as a filter spectrum. According to a preferred embodiment of the invention, the filter spectra are transformed into the time domain, for example via an IFFT. The spectra transformed into the time domain form the impulse response. Advantageously, the impulse response may be a linear-phase filter. Additionally, a minimum-phase filter may advantageously be employed for removing and/or impressing the at least one first or second spectrum with the first or second spectral properties, respectively. Such minimum-phase filter can be obtained from the linear-phase filter by a cepstral-transformation.

According to a preferred embodiment of the invention, the at least one first spectrum with at least one first spectral property and/or the at least one second spectrum with the at least one second spectral property are obtained by analyzing audio data. The audio data to be analyzed may include, for example, the aforementioned samples at the beginning or end of the variation range of the audio data. In this case, one would obtain, for example, from the analysis the tone color of very soft and/or very low (beginning of the variation range) and very loud and/or very high (end of the variation range). Preferably, the analysis includes determination of harmonics.

According to a preferred embodiment, at least part of the analysis is performed in the spectral domain. Preferably, the analysis in the spectral domain is performed with a Fourier transform, in particular a short time Fourier transform (STFT). While only portions of the audio data (sample) may be subjected to this analysis, the STFT is preferably applied to the entire sample.

According to another preferred embodiment of the invention, the harmonics are determined based on (local) maxima (peaks or cusps) in the spectrum of the audio data. Advantageously, an interpolation curve may be placed through at least a portion of the (local) maxima. Preferably, the (local) maxima as well as the (local) maxima of the interpolation curve remain unchanged. Because the harmonics are mapped by the maxima, this interpolation curve captures the formant character of the analyzed samples. For obtaining the tone color of, for example, a guitar, samples of guitar tones may therefore be analyzed.

The spectra of the tone color obtained in this way, i.e., the first or second spectrum with the first or second spectral property, respectively, can now be used to impress, as described above, the tone color of a guitar on, for example, the piano sample by removing from the piano the tone color of the piano through removal of the first spectrum, which in this case represents the spectral property 'tone color of the piano', and subsequently impressing the second sample which represents the spectral property 'tone color of the guitar'.

Any number of spectral fingerprints can be defined for each sample, which each spectral fingerprint describing the spectral character of a defined temporal segment.

The normalized source signal can be obtained by sending the source signal, depending on its playback position, through an associated defined weighted combination of the normalization filters for the different temporal segments, wherein their outputs are combined on a normalization bus. In an advantageous embodiment, continuous cross-fading is implemented between adjacent segments. The source signal normalized in this way can be transmitted from the normalization bus to any combination of different denormalization filters. The denormalization filters may be obtained from other targets signals, but also from the source signal itself. Combinations of the denormalization filters may map, for example, the temporal spectral course of the target signal. Advantageously, like with the normalization, a temporal cross-fade between adjacent segments is advantageous.

One exemplary application may be a saxophone tone playing a decrescendo. The following four fingerprints can be defined in this case:
1. Immediately at the beginning of the signal, a distinct noise character is generated during the build-up of the stationery fundamental oscillation.
2. Immediately after the beginning of the loud, stationery fundamental oscillation, the tone color is brilliant and full of harmonics.
3. In the middle of the signal, the tone-color contains fewer harmonics due to the decreasing loudness as a result of the decrescendo.
4. Shortly before the end of the tone, the tone color is somewhat dull due to the decreasing loudness resulting from the decrescendo and contains almost no harmonics.

To obtain an optimally adapted normalized source signal, the source signal may be introduced into the normalization filters belonging to the different fingerprints with time-dependent weighting.

For denormalization, the signal may then be returned from the normalization bus to the denormalization filters in real-time and, depending on the desired effect, with time-dependent weighting. For example, in the middle of the signal, continuous cross-fading into the tonal impression of the transient oscillation could again be performed.

Instead of dividing the signal into only a few segments (like the envelope segments in the preceding example), the signal may also be captured continuously during its entire running time. In this case, separate dedicated spectra are generated for all adjacent time segments. This "spectral sampling" may also be performed with overlapping time ranges, which further increases the time resolution.

In another preferred embodiment of the invention, the samples resulting from the Fourier transform, in particular the samples resulting from the STFT, are transformed into power density spectra. Advantageously, the power density spectra may be averaged and transformed back into an averaged spectrum. Advantageously, the spectral representation of the audio data may also be converted into a constant-Q spectrum before the peaks for detecting the harmonics are evaluated. Preferably, the conversion is performed from the averaged spectrum, i.e., from the result of the back-transformation of the averaged power density spectrum. Moreover, the conversion is preferably performed with conservation of energy.

An arrangement according to the invention includes at least one chip and/or processor and is configured to perform a method for processing audio data, wherein at least a first spectrum with at least one first spectral property is removed from the spectrum of the audio data and a second spectrum with at least one second spectral property is impressed on the spectrum of the audio data.

According to a preferred embodiment of the invention, the arrangement includes at least one filter for removing the at least one first spectrum and/or at least one filter for impressing the at least one first spectrum and/or the at least one second spectrum.

According to another preferred embodiment of the invention, the outputs of the at least one filter for removing the at least one first spectrum end of the inputs of the at least one filter for impressing the at least one first spectrum and/or the at least one second spectrum are connected with one another via a bus.

The arrangement may advantageously be configured for filtering at least partially by rapid convolution in an Overlap-Add and/or Overlap-Save method.

A computer program for processing audio data enables a data processing system, after the computer program has been loaded into the memory of the data processing system, to execute a method for processing audio data, wherein at least one first spectrum with at least one first spectral property is removed from the spectrum of the audio data and at least one second spectrum with at least one second spectral property is impressed on the spectrum of the audio data.

In another preferred embodiment of the invention, the computer program according to the invention has a modular structure, wherein individual modules are installed on different data processing systems.

Advantageous embodiments contemplate additional computer programs, with which additional method steps or process flows described in the description can be performed.

Such computer programs may be made available, for example, for downloading in a data or communications network (for a fee or free of charge, unrestricted or password-protected). The provided computer programs can be used by a method, wherein a computer program according to claim 25 is downloaded from an electronic data network, for example from the Internet, to a data processing system connected to the data network.

To perform the method of the invention for processing audio data, a computer readable storage medium may be employed, on which a program is stored which allows a data processing system, after the program has been loaded into the memory of the data processing system, to execute a method for processing audio data, wherein at least a first spectrum with at least one first spectral property is removed from the spectrum of the audio data and at least one second spectrum with at least one second spectral property is impressed on the spectrum of the audio data.

With the invention, the tone color of tones can be dynamically manipulated by impressing on them the tone colors of other tones. This makes possible, in particular, a control of the expression by cross-fading the tone colors of tones with different loudness, as well as a formant correction by cross-fading the tone colors of tones with a different pitch.

The invention represents a very precise formant correction, which is distinguished from other conventional methods since it treats harmonics significantly more exactly.

In summary, the invention can be described as follows:

One or several spectra with a spectral property, hereinafter also referred to as spectral fingerprint, are associated with each sample, with the spectral fingerprints describing the tone color as spectral states of the sample. The spectral fingerprints are determined in an analysis step.

The tone colors are manipulated in a two-step process by using a normalization filter and a denormalization filter.

The tone color described by a spectral fingerprint is removed from the source sample (e.g., a sample of their first instrument) with a normalizing filter by flattening all resonances. A signal is then obtained which has harmonics with a level of about 0 dB. The tonal impression of this normalized sample is similar to white noise that was filtered with a comb filter.

Using a denormalization filter, a tone color of a target sample (e.g., a sample with a different tone color which was produced, for example by a different strike force, or of a sample from a second instrument) described by an additional spectral fingerprint can then be impressed on this normalized sample. The harmonics are hereby set to the level characteristic for the tonal impression.

Spectral Fingerprints:

The spectral fingerprints are obtained in an exemplary embodiment with the following analysis process:

Short-Time Fourier Transform (STFT) of the entire sample;

Transforming the individual spectral frames into power density spectra (PDS);

Averaging the PDS by excluding frames with insufficient total power;

Back-transformation of the averaged PDS into an intermediate spectrum;

Energy-conserving transformation of the linear spectrum into a constant-Q spectrum;

Detection of harmonics as maxima of the spectrum in defined regions around the multiples of the fundamental frequency;

Interpolation of the individual peaks, wherein the sampling points are reproduced exactly.

The spectral fingerprints obtained with this process therefore represent in technical terms classical amplitude spectra which can be further processed with conventional methods, such as FFT or filtering.

(De-) Normalization Filter

The structure of the filters used for normalization and denormalization is identical, except for the different processing of the spectral fingerprints:

The difference is that

The spectrum of the spectral fingerprint $H(jw)$ is used directly as filter spectrum for the denormalization filter, and Conversely, the inverted spectrum of the spectral fingerprint $H(jw)^{-1}$ is used as filter spectrum for the normalization filter.

The identical processing steps include the following:

the (filter) spectrum is back-transformed via an IFFT into the time domain and forms the output impulse response;

the output impulse response is preferably shifted by half the block length in order to concentrate the energy of the impulse response in the center.

If the impulse response is to be shortened, this is preferably done symmetrically from the block boundaries, if necessary also with subsequent additional windowing for smoothing the block boundaries.

The generated impulse response represents a linear-phase filter and can be transformed via the real-value cepstral transformation into a minimal-phase filter.

Filtering

By dividing the filtering into the two-steps of normalizing and denormalizing, the aforedescribed tone color transformation can be performed with manageable complexity. This allows real-time processing which would be impossible when using a single filter or could only be performed with a preceding computation of all possible individual transformation filters. However, this would result in a computing complexity and memory requirement of quadratic or higher order.

In a preferred embodiment of the invention, the filters are connected so that the outputs of all normalizing filters terminate on a normalizing bus. This normalizing bus is connected with all inputs of the denormalizing filters. The actual filtering is performed in all filters with rapid convolution, for example with an Overlap-Add or Overlap-Save method.

As a result of the design with denormalizing and normalizing filters, an ideal noise-like signal is present on the normalizing bus at each point in time. The signal can be proportionately transformed in real-time into another tone color via any of the other denormalizing filters. This real-time operation can only be realized with the design having a normalizing bus. If this bus were nonexistent, then each possible tone color transformation would have to be known in advance and realized in a dedicated filter. However, this would be possible only in a limited way due to the exponential complexity.

The quality of the normalization depends on the constancy of the respective tone color. For example, a (de-) crescendo or a strong vibrato does not have a uniform tone color at all or only approximately a uniform tone color. However, with the invention, a very high accuracy can be attained by the aforementioned use of several fingerprints.

The method of the invention can be used within a sampler to even out the transitions between different samples with respect to a different pitches and different strike forces.

Classically, the samples inside a sampler are arranged in a sample map, wherein different pitches are arranged horizontally and different strike forces are arranged vertically. At the instance a key is pressed, the pitch and the strike force are clearly defined, so that a predetermined sample from the map can be played.

If the tone color of the played sample is to be transformed into another sample, then frequently cross-fading of the time signals is employed. However, this causes beat frequencies. In order to adapt the tone color, frequently simple high-pass or low-pass filters are used; however, these are significantly inferior to the normalizing and denormalizing filters of the invention.

With the method of the invention, an additional fingerprint map can be placed over the sample map. It consists of fingerprints, wherein one or several fingerprints are associated with each sample. If only a single fingerprint is associated, then this fingerprint describes the tone color of the entire sample; if several fingerprints are associated, then please describe each the tone color of a single segment or point in time. Each fingerprint is hereby in advance transformed into a normalizing and denormalizing filter.

If a note is played, then the pitch and the strike force are defined at the instance the key is pressed, like with a conventional sampler. The sample represented by these parameters, however, is not played directly. Instead, the (time-dependent) source signal is supplied proportionately to the normalizing filters in correspondence to its position in the fingerprint map, with the outputs of the normalizing filters converging on the normalizing bus. The signal on the normalizing bus is then supplied proportionately to those denormalizing filters which are closest to an arbitrary point inside the fingerprint map. This point can be modulated in real-time, which directly cross-fades the tone color. This aspect represents the great strength of the method of the invention.

The various features of novelty which characterize the invention are pointed out with particularity in the claims annexed to and forming a part of the disclosure. For a better understanding of the invention, its operating advantages, and specific objects attained by its use, reference should be had to the drawing and descriptive matter in which there are illustrated and described preferred embodiments of the invention.

BRIEF DESCRIPTION OF THE DRAWINGS

Several exemplary embodiment of the invention will now be described with reference to the figures of the drawings, which show in.

DETAILED DESCRIPTION OF THE DRAWINGS

Figure 1:
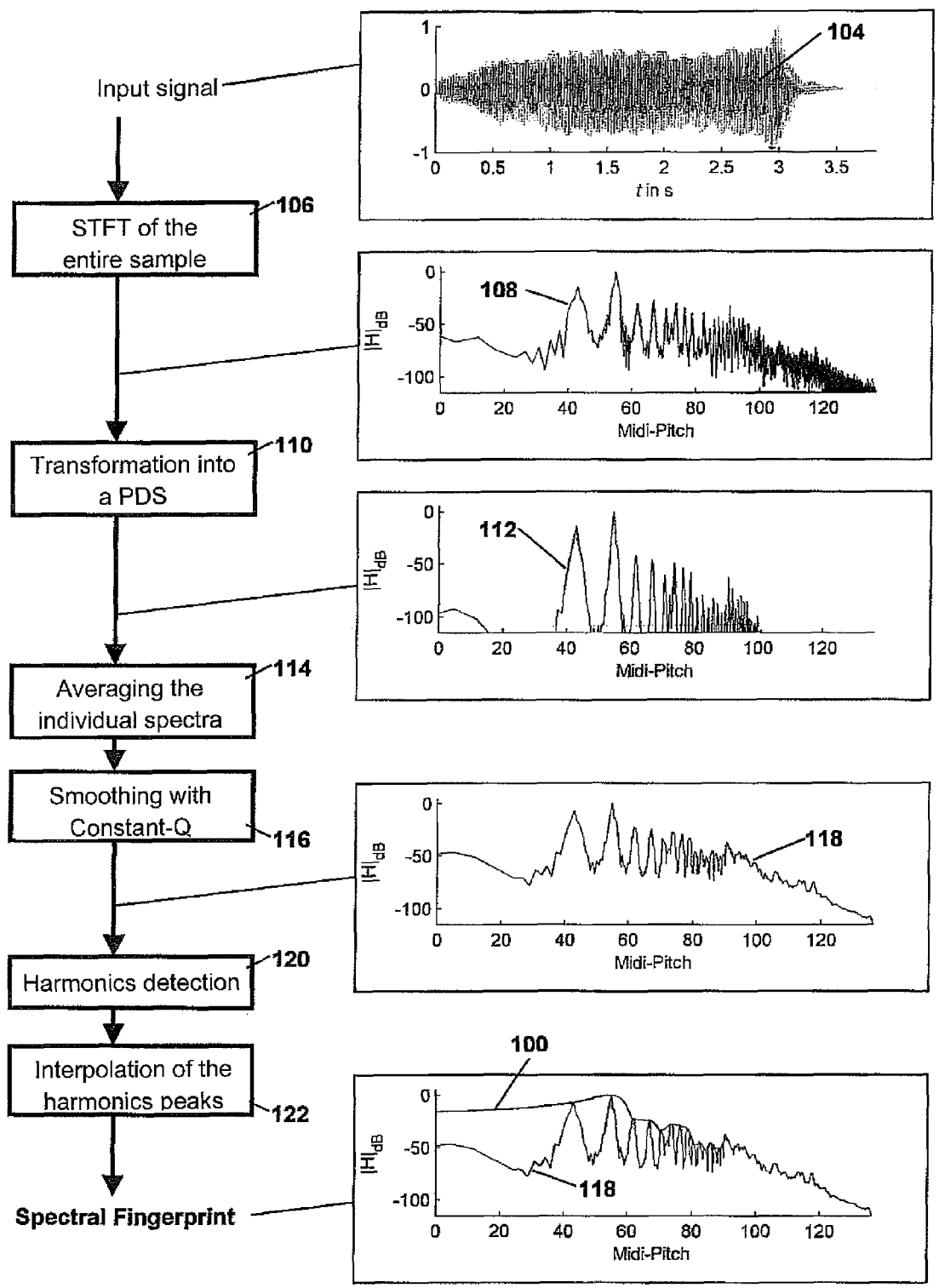
FIG. 1 is a diagram of an exemplary analysis of an audio sample for determining a spectral fingerprint.

FIG. 1 describes a manner in which a spectral fingerprint 100 is obtained with an exemplary analysis method.

At a first step, a STFT is applied on the input signal 104 (step 106), generating an intermediate spectrum 108. At step 110, the individual spectral frames of the intermediate spectrum 108 are transformed into power density spectra 112. At a subsequent step 114, the individual spectra are averaged and back-transformed into an intermediate spectrum, smoothed at step 116, and transformed into a constant-Q spectrum 118.

At a next step 120, the harmonics are detected as peaks (maxima) of the constant-Q spectrum 118. At step 122, an interpolation curve is placed through these maxima, wherein the interpolation curve goes exactly through the maxima as sampling points. This interpolation curve represents the spectral fingerprint 100.

The input signal 104 may be an audio signal of an arbitrary tone or of an arbitrary instrument. These may be, in particular, very soft, very loud, very low, very high tones, or generally tones which are essentially at the boundaries of a variation range of the audio signal or tone, respectively.

Figure 2A:
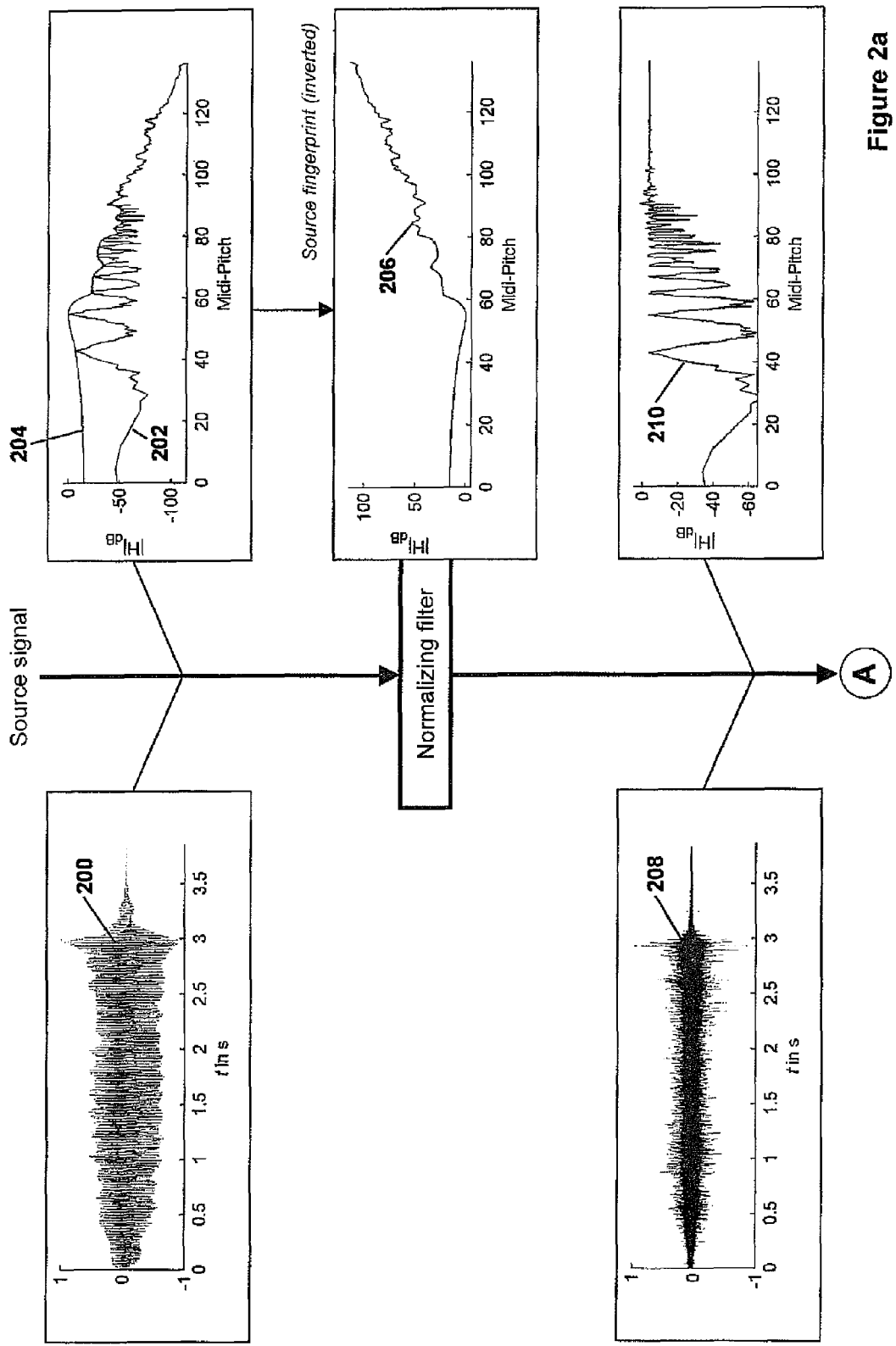
FIG. 2a is a diagram of exemplary processing of an audio sample, from which a source fingerprint is removed for obtaining a normalized source signal.
Figure 2B:
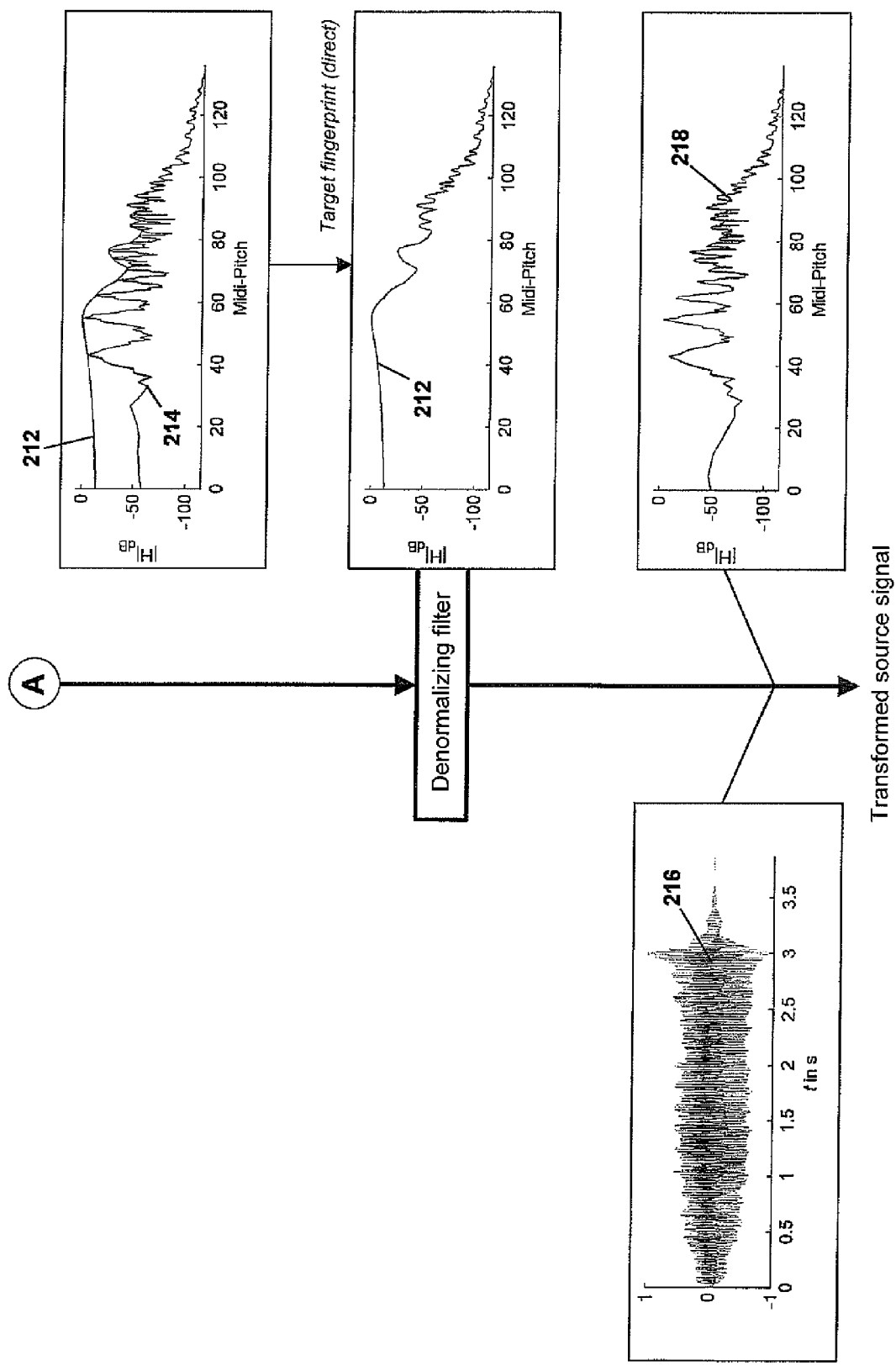
FIG. 2b is a diagram of exemplary processing of a normalized source signal, on which a target fingerprint is impressed for obtaining a transformed source signal.

The change of a spectral property, for example due to a change in the strike force, of a source signal 200 will now be described in more detail with reference to FIGS. 2a and 2b. The exemplary source signal 200 illustrated in FIG. 2a represents a strongly played tone with many harmonics. This source signal 200 is transformed into a spectral representation 202. A normalizing filter is then applied to this source signal, wherein the spectrum 206 of the inverted spectral fingerprint of the source signal 200 is used as filter spectrum (the fingerprint 204 itself is illustrated in FIG. 2a together with the spectral representation 202 of the source signal 200).

Filtering produces a normalized source signal 208 with associated spectrum 210. As seen in FIG. 2a, the harmonics of the spectrum 210 of the normalized source signal 208 has an approximately uniform level of 0 dB. The spectrum 210 of the normalized source signal 208 can now be transformed, without affecting the spectral properties in an undesirable manner, because the spectral properties were previously filtered out. For example, the loudness of the source signal 200 can be reduced. The normalized source signal 208 is now filtered by using a denormalizing filter, wherein the spectral fingerprint 212 of the target signal is used as filter spectrum; the spectrum 214 of the target signal is depicted in FIG. 2b. The target signal may be, like in the illustrated example, a weakly played tone. As a result of the filtering, the transformed source signal 216 with the associated spectrum 218 is obtained. The transformed source signal 216 represents a signal on which the tone color of a softly played tone (target signal) is impressed (indicated in the drawing by the comparatively small number of harmonics of the transformed source signal 216). There-after, the loudness of the transformed source signal 216 can be reduced independent of the aforedescribed method used to change the tone color.

According to another exemplary embodiment, at least two filters are applied on the normalized source signal 208, which may have been changed in additional processing steps (such as loudness or tone pitch change), wherein the spectra of different fingerprints are used as filter spectra. According to a preferred embodiment, the spectra are weighted. If the transformation, for example, relates to the change of the tone color commensurate with a change in loudness, and the transformed source signal 216 is to be located in the middle of the variation range, then the spectrum of the fingerprint of the softest tone and the spectrum of the fingerprint of the loudest tone can be used as filter spectra, each weighted with about 50%.

The implementation of the invention is not limited to the exemplary embodiments described above. Instead, a number of modifications may be contemplated which take advantage of the arrangement according to the invention and the method according to the invention as well as the corresponding computer program and the corresponding computer-readable storage medium, even in fundamentally different embodiments.

The invention is not limited by the embodiments described above which are presented as examples only but can be modified in various ways within the scope of protection defined by the appended patent claims.

We claim:

1. A method for processing audio data, wherein
   at least one filter spectrum is derived from at least one audio signal, for each of the filter spectra, the deriving comprising:
   transforming the at least one audio signal into a spectral representation,
   defining the filter spectrum as an interpolation curve of the spectral representation which expresses the formant character of the at least one audio signal,
   the processing of the audio data comprising at least:
   providing to at least one first filter source audio data representing a first audio signal with first spectral properties, for removing from the source audio data the formant character of the first audio signal, where the at least one first filter is based on at least one first filter spectrum derived from the first audio signal, and
   providing the filtered source audio data to at least one second filter, where the at least one second filter is based on at least one second filter spectrum derived from at least one target audio signal with at least one second spectral properties, for impressing on the filtered source audio data the formant character of the at least one target audio signal.
2. The method according to claim 1, wherein the at least one audio signal is divided into temporal segments and that for at least a portion of the temporal segments a corresponding segment-specific filter spectrum is derived.
3. The method according to claim 2, wherein the temporal segments overlap.
4. The method according to claim 1, wherein for removing the formant character, the at least one first filter is based on the inverted at least one first filter spectrum.
5. The method according to claim 1, wherein for impressing the formant character, the at least one second filter is based directly on the at least one second filter spectrum.
6. The method according to claim 4, wherein the at least one first filter is generated by transforming the inverted at least one first filter spectrum into the time domain, and/or
   wherein the at least one second filter is generated by transforming the at least one second filter spectrum into the time domain.
7. The method according to claim 6, wherein the at least one of the first and second filters is a linear-phase filter.
8. The method according to claim 7, wherein a minimal-phase filter is generated with a cepstral-transformation of the linear-phase filter.
9. The method according to claim 7, wherein at least a portion of the first audio signal and/or of the first filter spectrum is weighted.
10. The method according to claim 1, wherein before the interpolation, at least one power intensity spectrum is generated from the spectral representation of the audio signal.
11. The method according to claim 10, wherein averaging of the at least one power density spectrum or of a part of the power density spectra is performed.
12. The method according to claim 1, wherein the spectral representation is transformed into a constant-Q-spectrum before or after detection of harmonics.
13. The method according to claim 10, wherein the transformation into the constant-Q-spectrum is performed after a back-transformation of the at least one power density spectrum into an intermediate spectrum.
14. The method according to claim 1, wherein the filtering is performed at least in part by rapid convolution in an Overlap-Add and/or Overlap-Save method.
15. An arrangement with at least one chip and/or processor, wherein the arrangement is configured to perform a method according to claim 1.
16. The arrangement according to claim 15, wherein the arrangement comprises at least one first filter for removing the formant character of the first audio signal and/or at least one second filter for impressing the formant character of the target audio signal.
17. The arrangement according to claim 16, wherein the outputs of the at least one first filter and the inputs of the at least one second filter are connected via a bus.
18. The arrangement according to claim 16, wherein the arrangement includes a sampler.
19. The arrangement according to claim 18, wherein first and/or second spectra with the first and second spectral property, respectively, are stored in the sampler, with the respective spectra associated with samples of the sampler.
20. The method according to claim 1 wherein the method is executed by a data processing system stored with a computer program.
21. A non-transitory computer readable storage medium, on which a program is stored which enables a data processing system, after the program is loaded into the storage means of the data processing system, to execute a method according to claim 1.
22. The method according to claim 1, wherein after removal of the formant character of the first audio signal, the filtered source audio data is transformed, and one or several of the formant character of the at least one target audio signal are impressed on the transformed audio signal.

* * * * *

UNITED STATES PATENT AND TRADEMARK OFFICE
CERTIFICATE OF CORRECTION

| | | |
|---|---|---|
| PATENT NO. | : 8,750,530 B2 | Page 1 of 1 |
| APPLICATION NO. | : 12/883001 | |
| DATED | : June 10, 2014 | |
| INVENTOR(S) | : Gunnar Eisenberg and Frank Elting | |

It is certified that error appears in the above-identified patent and that said Letters Patent is hereby corrected as shown below:

On the Title Page, item (54) and in the Specification, Column 1, lines 1-5, the title "METHOD AND ARRANGEMENT FOR PROCESSING AUDIO DATA, AND A CORRESPONDING CORRESPONDING COMPUTER-READABLE STORAGE MEDIUM" should be changed to "--METHOD AND ARRANGEMENT FOR PROCESSING AUDIO DATA, AND A CORRESPONDING COMPUTER PROGRAM AND A CORRESPONDING COMPUTER-READABLE STORAGE MEDIUM--"

Signed and Sealed this
Sixteenth Day of June, 2015

Michelle K. Lee
*Director of the United States Patent and Trademark Office*